United States Patent [19]

Shimizu

[11] Patent Number: 5,657,469
[45] Date of Patent: Aug. 12, 1997

[54] SELECTIVE ACCESS TO DIVIDED WORD LINE SEGMENTS IN CACHE MEMORY

[75] Inventor: Tamio Shimizu, Tokyo, Japan

[73] Assignee: NEC Corporation, Tokyo, Japan

[21] Appl. No.: 549,073

[22] Filed: Oct. 27, 1995

[30] Foreign Application Priority Data

Oct. 28, 1994  [JP]  Japan .................................. 6-265564

[51] Int. Cl.⁶ ........................................... G06F 12/04
[52] U.S. Cl. .............................. 395/445; 365/189.01
[58] Field of Search .................... 364/DIG. 1; 365/72, 365/154, 182, 104, 238.5, 189.01; 395/445

[56] References Cited

U.S. PATENT DOCUMENTS

| | | | |
|---|---|---|---|
| 4,031,516 | 6/1977 | Kashio ................................... | 395/887 |
| 4,346,458 | 8/1982 | Berger et al. .......................... | 365/154 |
| 4,596,000 | 6/1986 | Wiedmann .............................. | 365/72 |
| 4,618,943 | 10/1986 | Aipperspach et al. ................. | 365/104 |
| 4,636,984 | 1/1987 | Neukomm .............................. | 365/182 |
| 4,918,648 | 4/1990 | Taguchi et al. ....................... | 364/419.17 |
| 5,126,973 | 6/1992 | Gauia et al. ............................ | 365/200 |
| 5,289,423 | 2/1994 | Natale et al. ......................... | 365/185.12 |
| 5,369,651 | 11/1994 | Marisetty ............................... | 371/40.1 |

*Primary Examiner*—Tod R. Swann
*Assistant Examiner*—James Peikari
*Attorney, Agent, or Firm*—Young & Thompson

[57] ABSTRACT

A DRAM using a divided word line scheme has a cache operation capability. A cache line has a data corresponding to sub-block data. Each data set of sub-block is related to the individual main word address. The DRAM has an extra data storage for selecting a data transfer mode between a sense latch and the storage. With the storage, the DRAM is capable of transferring a plurality of data sets having different row addresses to the sense latch at the same time.

6 Claims, 12 Drawing Sheets

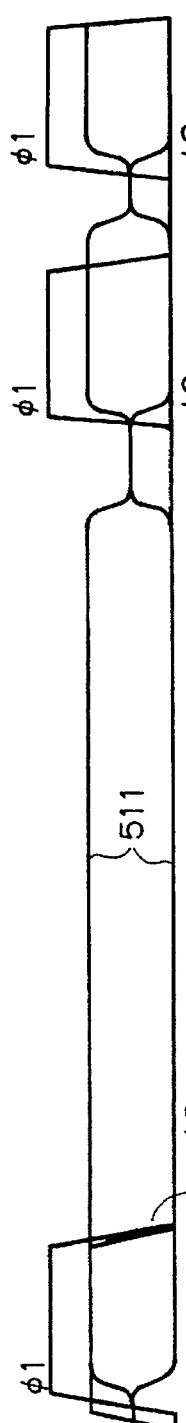
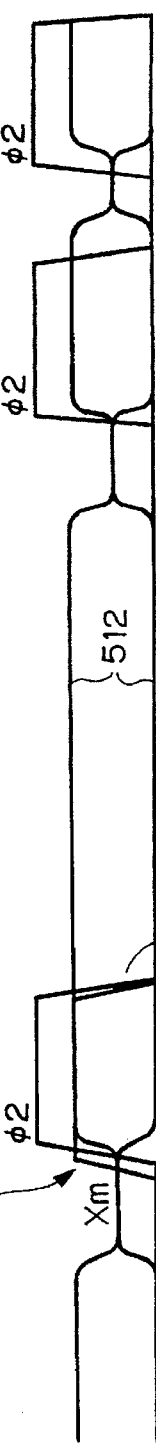
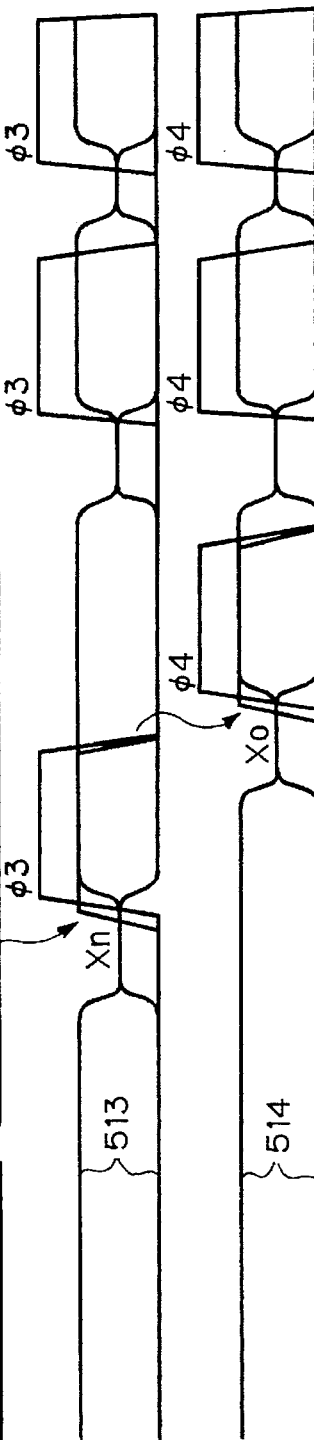
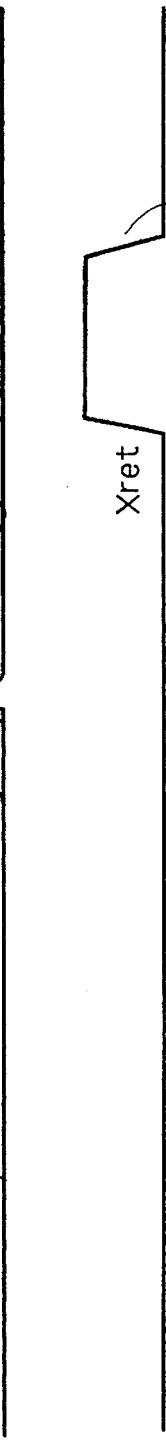
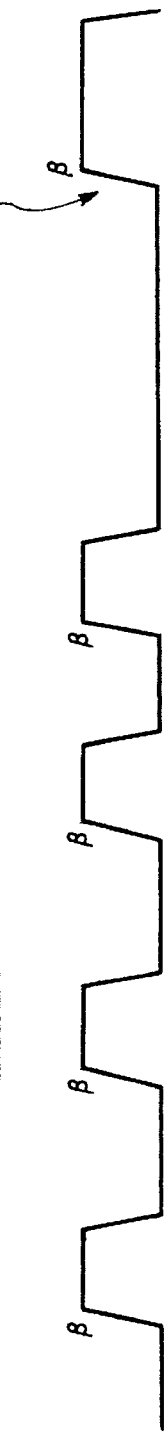
Fig. 10A
Fig. 10B
Fig. 10C
Fig. 10D
Fig. 10E
Fig. 10F

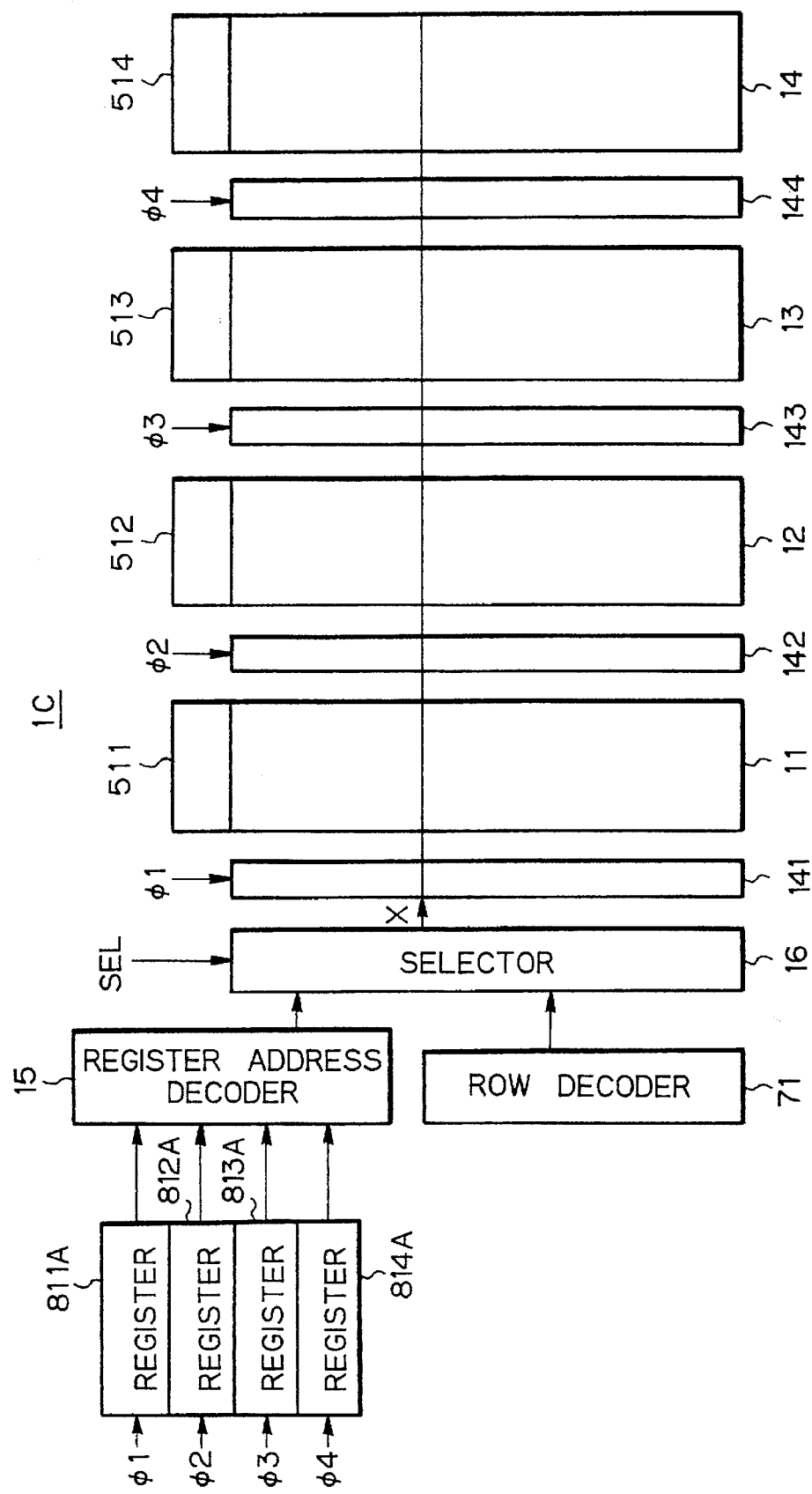

SELECTIVE ACCESS TO DIVIDED WORD LINE SEGMENTS IN CACHE MEMORY

BACKGROUND OF THE INVENTION

1. Field of the Invention

The present invention relates to a semiconductor memory and, more particularly, to a semiconductor memory having cache holding means for temporarily holding data on a row address basis, i.e., cache data.

2. Description of the Related Art

A semiconductor memory of the type described has a main memory implemented as a low-speed large-capacity DRAM (Dynamic Random Access Memory), and a buffer memory or cache memory for the high-speed access of the DRAM. The cache memory is implemented as high-speed small-capacity registers or a bipolar RAM (Random Access Memory) capable of temporarily storing the data of the DRAM on a row basis. The cache memory which is expensive is sometimes replaced with a high-speed access mechanism, e.g., page mode or static column mode available with the DRAM. The cache memory and the substitute therefor will hereafter be referred to as cache holding means.

Specifically, data stored in the main memory on a row address basis and which a CPU (Central Processing Unit) is likely to need, i.e., cache data are copied in the cache holding means. If the data at the time of a memory access from the CPU is coincident with any one of the cache data (cache hit), the CPU receives the cache data within the access time of the cache holding means. If the data of the above address does not coincide with any of the cache data (cache miss), the CPU receives necessary data from the main memory in a usual memory access cycle. Hence, the CPU achieves a access at a higher speed in the event of a cache hit than in the event of a cache miss.

A cache hit ratio, i.e., a ratio of cache hits to memory accesses must be increased in order to improve the performance of a computer system. Generally, the cache hit ratio can be improved if the cache holding means is provided with a greater number of cache data blocks independent of each other, i.e., a greater number of entries. A semiconductor memory directed toward a greater number of entries is taught in, e.g., Japanese Patent Laid-Open Publication No. 3-21289. In the memory taught in this document, one cache holding means is assigned to each sense amplifier corresponding to a row decoder in order to increase the number of entries.

Today, microtechnologies derived from advanced DRAM implementations, including high integration and large capacity, made it possible to provide a memory with row address select lines (referred to as word lines hereinafter) consisting of main word lines and subword lines. This kind of memory structure successfully promotes rapid access to the memory.

Generally, the above described type of semiconductor memory has a memory circuit including cache holding means, a memory controller for feeding addresses and select signals to the memory circuit, and a data bus. In response to an address and a select signal, the memory circuit compares the address with the row addresses of data stored in the cache holding means. If the two addresses are coincident, the memory circuit outputs the corresponding data to the data bus while outputting a corresponding response to the memory controller. If the addresses are not coincident, the memory circuit accesses memory cell data by a usual memory access, outputs the data to the data bus, and outputs a response to the memory controller.

In the memory taught in the previously mentioned Japanese Patent Laid-Open Publication No. 3-21289, the cache data to be dealt with by the cache holding means has a unit size corresponding to data read out by a single access from the row decoder, i.e., a word. This brings about a problem that the same number of entries is required even with data which is sized smaller than a word and can be held in a distributed manner. This limits the freedom available with the memory and prevents the number of entries from being increased. Moreover, because the cache holding means hold data on a row decoder basis, it cannot hold a plurality of independent data in the column direction without resorting to extra holding means.

SUMMARY OF THE INVENTION

It is, therefore, an object of the present invention to provide a semiconductor memory having cache holding means and capable of increasing the cache hit ratio.

In accordance with the present invention, a semiconductor memory has a plurality of memory cell blocks constituted by dividing, on the basis of a first predetermined number of rows, memory cell arrays each having memory cells arranged in rows and columns and allowing data to be selectively input or output when a row address and a column address are designated. The memory cell blocks each has sub-blocks subdivided by a second predetermined number in a column direction, main word lines provided in the first predetermined number, and each corresponding to a row address assigned to each of the first predetermined number of rows, subword lines provided in the second predetermined number and constituted by dividing the main word lines in correspondence with the second predetermined number of sub-blocks, a subword line selecting device for selecting any one of the subword lines in response to a sub-blocks select signal, and a cache holding device for holding cache data stored in one row of memory cells of the main word line corresponding to a selection row address designated beforehand. Data is selectively written to or read out of the cache holding device when an external row address designated from the outside and the selection row address are coincident. A row address holding device is provided in the first predetermined number, and holds the first predetermined number of row addresses and selectively outputting contents thereof in response to the sub-block select signal. The cache holding devices holds the second predetermined number of subrow data which are one row of data of the sub-blocks respectively corresponding to the subword lines respectively corresponding to the first predetermined number of row addresses.

Also, in accordance with the present invention, a semiconductor memory has a plurality of memory cell blocks constituted by dividing, on the basis of a first predetermined number of rows, memory cell arrays each having memory cells arranged in rows and columns and allowing data to be selectively input or output when a row address and a column address are designated. The memory cell blocks each has sub-blocks subdivided by a second predetermined number in a column direction, main word lines provided in the first predetermined number, and each corresponding to a row address assigned to each of the first predetermined number of rows, subword lines provided in the second predetermined number and constituted by dividing the main word lines in correspondence with the second predetermined number of sub-blocks, a subword line selecting device for selecting any one of the subword lines in response to a sub-block select signal, and a cache holding device for holding cache data stored in one row of memory cells of the main word line corresponding to a selection row address designated beforehand. Data are selectively written to or read out of the cache holding device when an external row address designated from the outside and the selection row address are coincident. A subrow address holding device is provided in the second predetermined number, and holds subrow addresses provided in the second predetermined number. A subrow address selecting device selects, in response to the sub-block select signal, one of the second predetermined number of subrow address holding devices to thereby generate a first main word select signal. A row decoder decodes the external row address to thereby generate a second main word select signal. A main word signal selecting device selects either the first main word signal or the second main word signal in response to a control signal. The cache holding devices holds the second predetermined number of subrow data which are one row of data of the sub-blocks respectively corresponding to the subword lines respectively corresponding to the first predetermined number of row addresses.

BRIEF DESCRIPTION OF THE DRAWINGS

The above and other objects, features and advantages of the present invention will become more apparent from the following detailed description taken with the accompanying drawings in which:

FIGS. 10A, 10B, 10C, 10D, 10E and 10F show timing chart representative of a specific operation of the third embodiment; and FIG. 11 is a block diagram schematically showing a fourth embodiment of the present invention.

DESCRIPTION OF THE PREFERRED EMBODIMENTS

Figure 1:
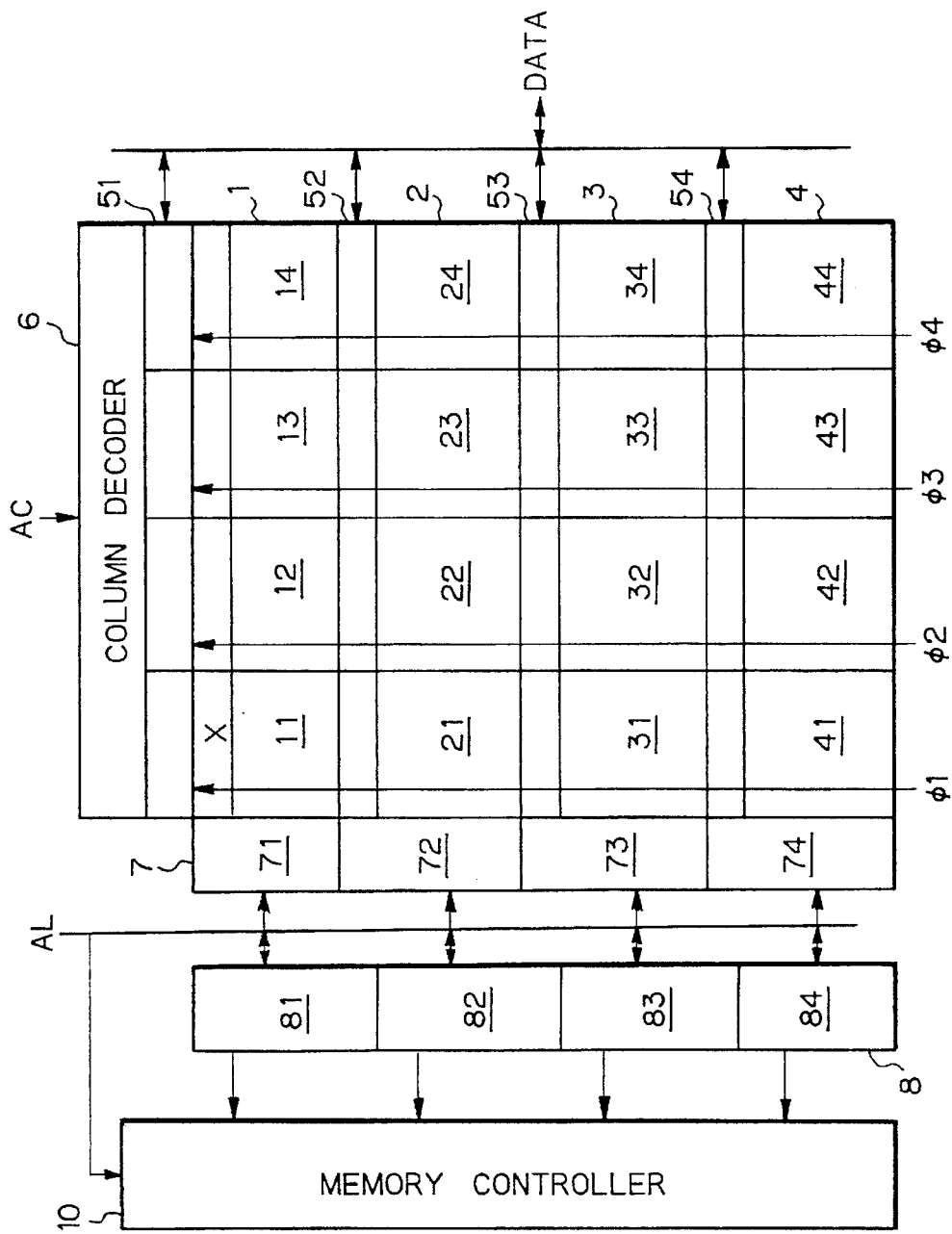
FIG. 1 is a block diagram schematically showing a conventional semiconductor memory.

To better understand the present invention, a brief reference will be made to a memory circuit included in a conventional semiconductor memory taught in the previously mentioned Japanese Patent Laid-Open Publication No. 3-21289. As shown, the memory has blocks 1–4 of memory cells divided on a row basis, i.e., a main word line basis, sense amplifier groups 51–54, a column decoder 6, a row decoder group 7, a register group or cache memory 8, and a memory controller 10 for directly accessing the sense amplifiers 5 on a cache hit or directly accessing the memory cell array 1 on a cache miss.

The blocks 1–4 are respectively subdivided into sub-blocks 11–14, 21–24, 31–34 and 41–44 in the column direction in correspondence with subword lines. The row decoder group 7 is made up of row decoders 71–74 respectively assigned to the blocks 1–4. The row decoders 71–74 drive main word lines X associated with the blocks 1–4 in accordance with a row address. The sense amplifier groups 51–54 are assigned to the sub-blocks 11–14, 21–24, 31–34, and 41–44, respectively. Each sense amplifier, which will be described, included in the groups 51–54 amplifies and holds the data of the respective cell. The column decoder 6 selects any one of the sense amplifiers in response to a column address signal AC and interchanges data with an input/output circuit, not shown. The register group 8 has registers 81–84 respectively assigned to the blocks 1–4, and each holds the row address accessed last.

The memory controller 10 supervises a row address input from the outside (referred to as an external row address hereinafter) and the register address. When the external row address coincides with any one of the addresses of the register group 8, i.e., in the event of a cache hit, the controller 10 directly writes or reads data in or out of corresponding one of the sense amplifier groups 51–54. If the external row address does not coincide with any of the addresses of the register group 8, i.e., in the event of a cache miss, the controller 10 precharges the sense amplifier groups 51–54, accesses the memory cell designated by the external row address, and updates the corresponding register with the external row address.

Figure 2A:
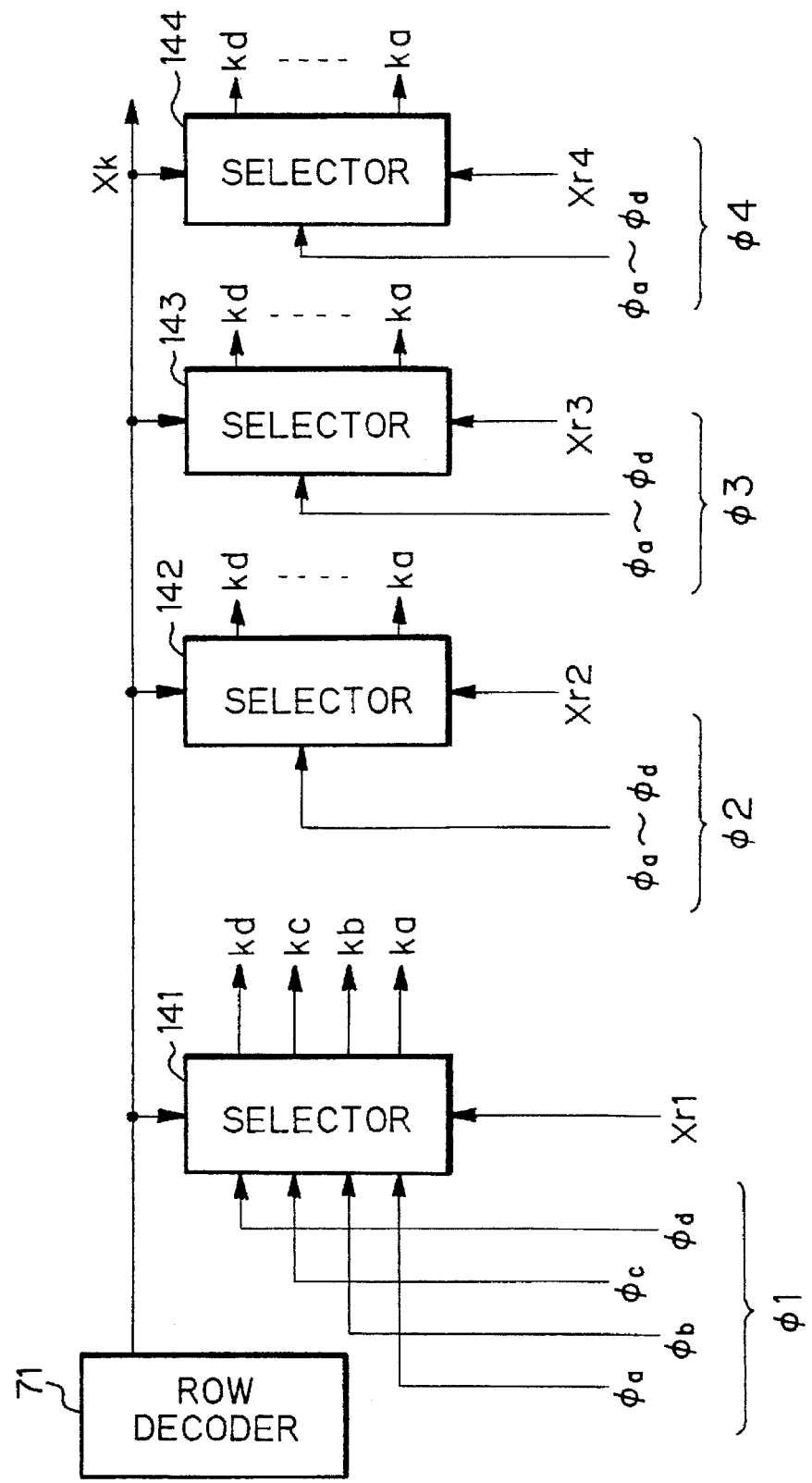
FIGS. 2A and 2B are schematic block diagrams respectively showing a relation between a main word line and subword lines, and a specific configuration of a selector.

The construction and operation of the above-described device will be described more specifically, taking the block 1 as an example. As shown in FIG. 2A, the block 1 has a main word line XK, selectors 141–144 having an identical configuration, and subword lines Ka–Kd extending out from each of the selectors 141–144. A main word signal Xk output from the row decoder 71 is transferred over the main word line XK. The selectors 141–144 each receives the main word signal Xk and, in response, outputs subword signals ka–kd respectively corresponding to sub-block select signals $\phi a$–$\phi d$ to associated one of the sub-blocks 11–14. The subword signals ka–kd from the selectors 141–144 are transferred over the respective subword lines Ka–Kd. Specifically, the select signals $\phi a$–$\phi d$ are applied to each of the selectors 141–144 in order to select one of the four subword lines Ka–Kd. When the selectors 141–144 receive inactivate signals $Xr_1$–$Xr_4$, respectively, they bring the associated subword lines Ka–Kd to an inactive level.

Figure 2B:
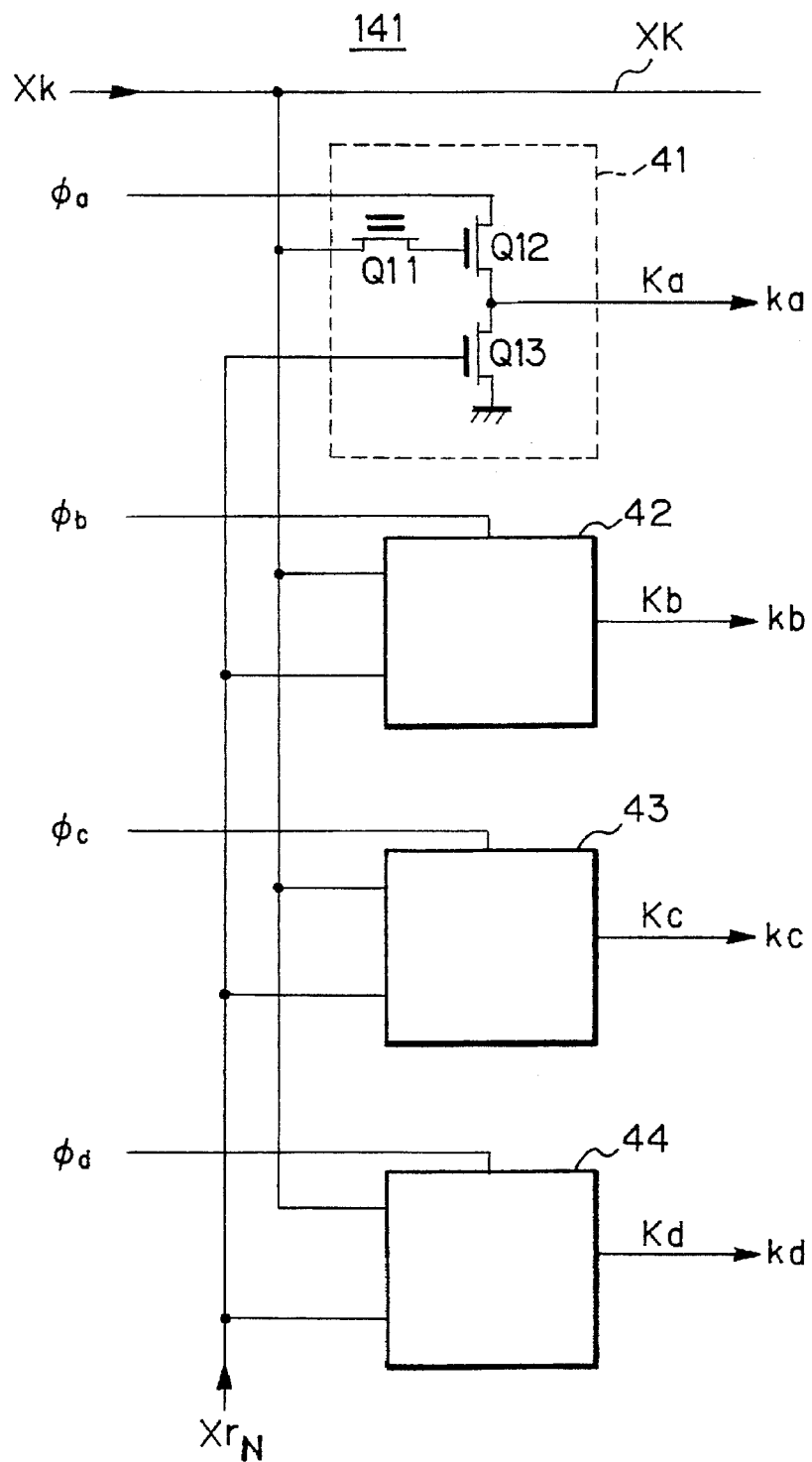

FIG. 2B shows the selector 141 specifically. As shown, the selector 141 has subword output circuits 41–44 having an identical configuration. The circuits 41–44 receive the main word signal Xk and respectively output the subword signals ka–kd in response to the select signals (active level) $\phi a$–$\phi d$. The subword output circuit 41, for example, has N-channel transistors Q11, Q12 and Q13. The transistor Q11 has a source connected to the main word line XK, a gate connected to a power source, and a drain connected to the gate of the transistor Q12. The transistor Q12 has a drain receiving the signal $\phi a$ and a source connected to the subword line Ka. The transistor Q13 has a drain connected to the subword line Ka, a gate receiving the inactivate signal $Xr_n$, and a source connected to ground. The other subword output circuits are identical in construction with the circuit 41, except that they are respectively assigned to the subword lines Kb, Kc and Kd and the select signals $\phi b$, $\phi c$ and $\phi d$.

The selectors 141–144 select only one of the subword lines Ka–Kd in the entire memory without exception. In this sense, let the select signals $\phi a$–$\phi d$ applied to the sub-blocks corresponding to the subword line selected be represented by select signals φ for simplicity. Further, let the select signals φ be represented by φ1-φ4 respectively corresponding to the subword signals of the sub-blocks 11-14, 21-24, 31-34, and 41-44.

Figure 3:
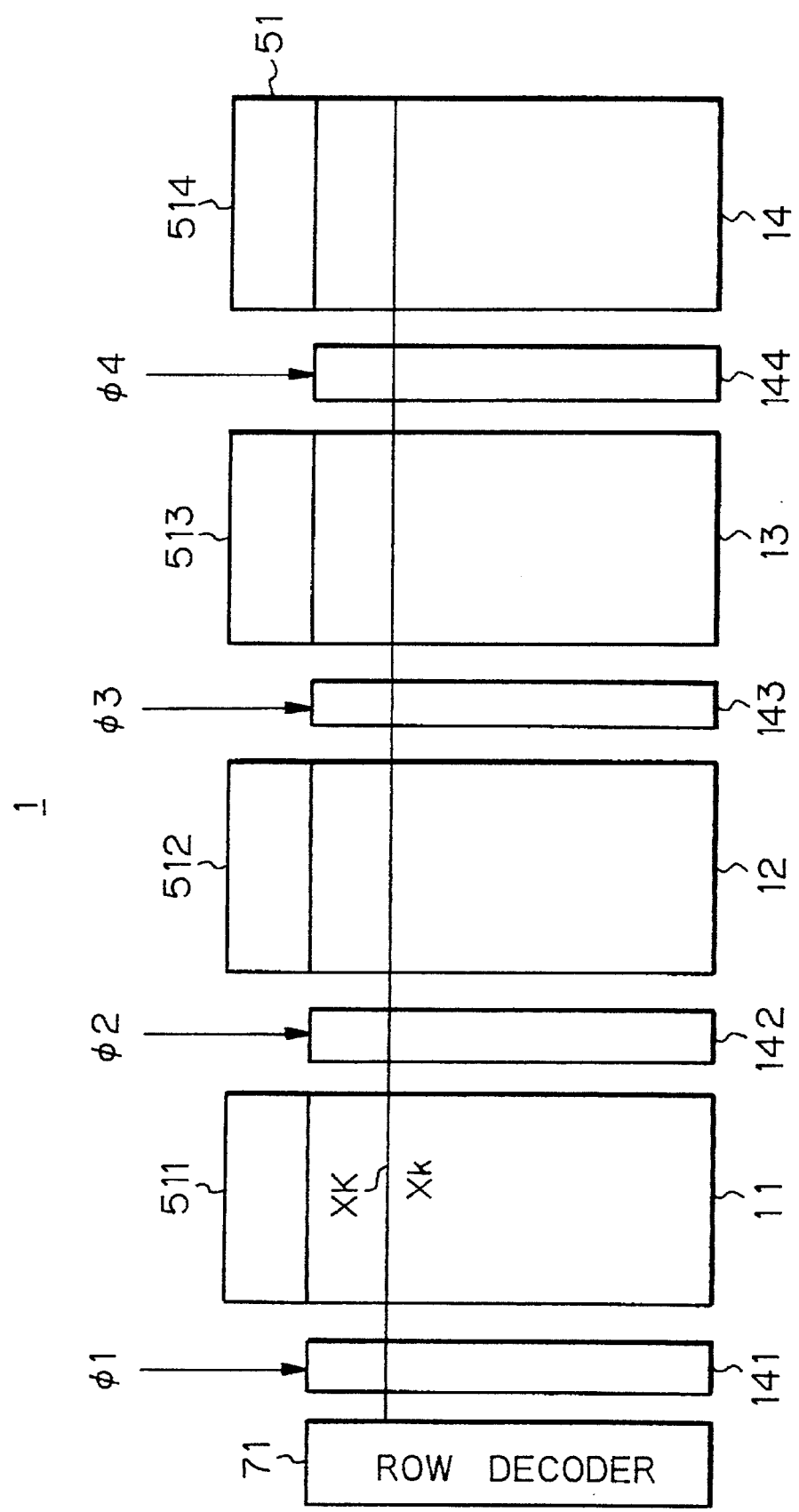
FIG. 3 is a timing chart representative of the operation of the conventional memory.

FIG. 3 shows a relation between the row decoder 71 and sense amplifier group 51 and the block 1. As shown, the main word signal Xk from the row decoder 71 is fed to one of the sub-blocks 11-14 as a subword signal selected by the selectors 141-144 in response to the subword select signals φ1-φ4. The sense amplifier group 51 is made up of sense amplifiers 511-514 respectively corresponding to the sub-blocks 11-14.

In operation, the sense amplifier group 51 holds the data of the row address of the block accessed last. If the external address fed from the memory controller 10 is not held in the sense amplifier group 51, the circuit 10 precharges the sense amplifier group 51 and associated bit line potential. Subsequently, the controller 10 causes the main word signal Xk to go high, sequentially raises the select signals φ1-φ4 in correspondence with the subword lines K1-K4, and then causes the sense amplifiers 511-514 to respectively read data out of the cells corresponding to the main word line XK, thereby storing one row of data in the sense amplifier group 51.

The above procedure successfully stores data around the latest access data in the sense amplifier groups at all times and allows them to be accessed at high speed, thereby enhancing the performance of the memory.

However, the conventional memory described above has some problems yet to be solved, as discussed earlier.

Figure 4:
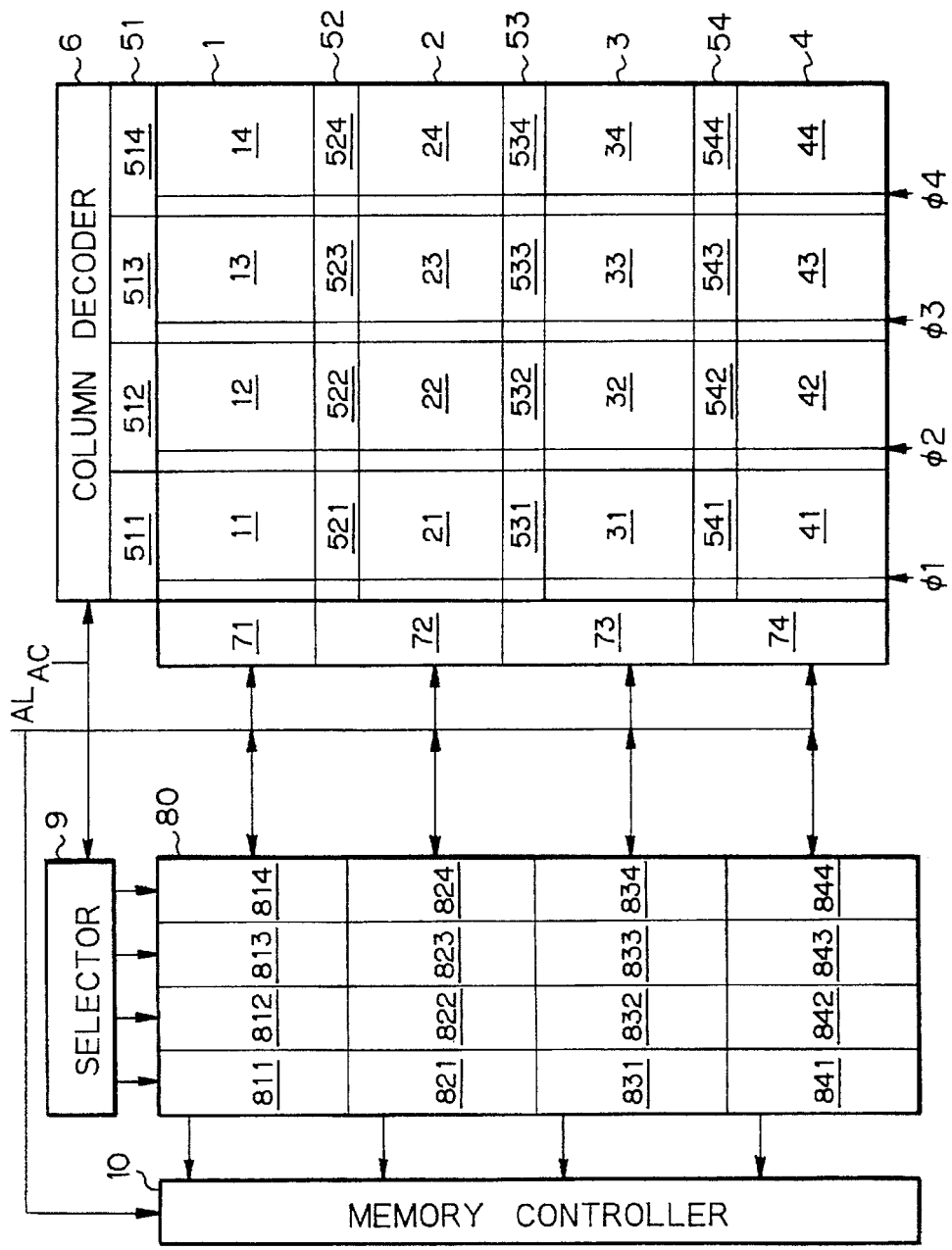
FIG. 4 is a block diagram schematically showing a first embodiment of the semiconductor memory in accordance with the present invention.

Referring to FIG. 4, a first embodiment of the semiconductor memory in accordance with the present invention will be described. In FIG. 4, the same or similar constituent parts as the parts shown in FIG. 1 are designated by the same reference numerals, and a detailed description thereof will not be made in order to avoid redundancy. As shown, the embodiment is different from the conventional memory of FIG. 1 in that a register group 80 and a selector 9 are included in place of the register group 8. The register group 80 has four groups of registers 811-814, 821-824, 831-834, and 841-844; in each group, the registers are respectively assigned to the subword lines K1-K4. The selector 9 selects the registers in response to a column address AC.

Figure 5:
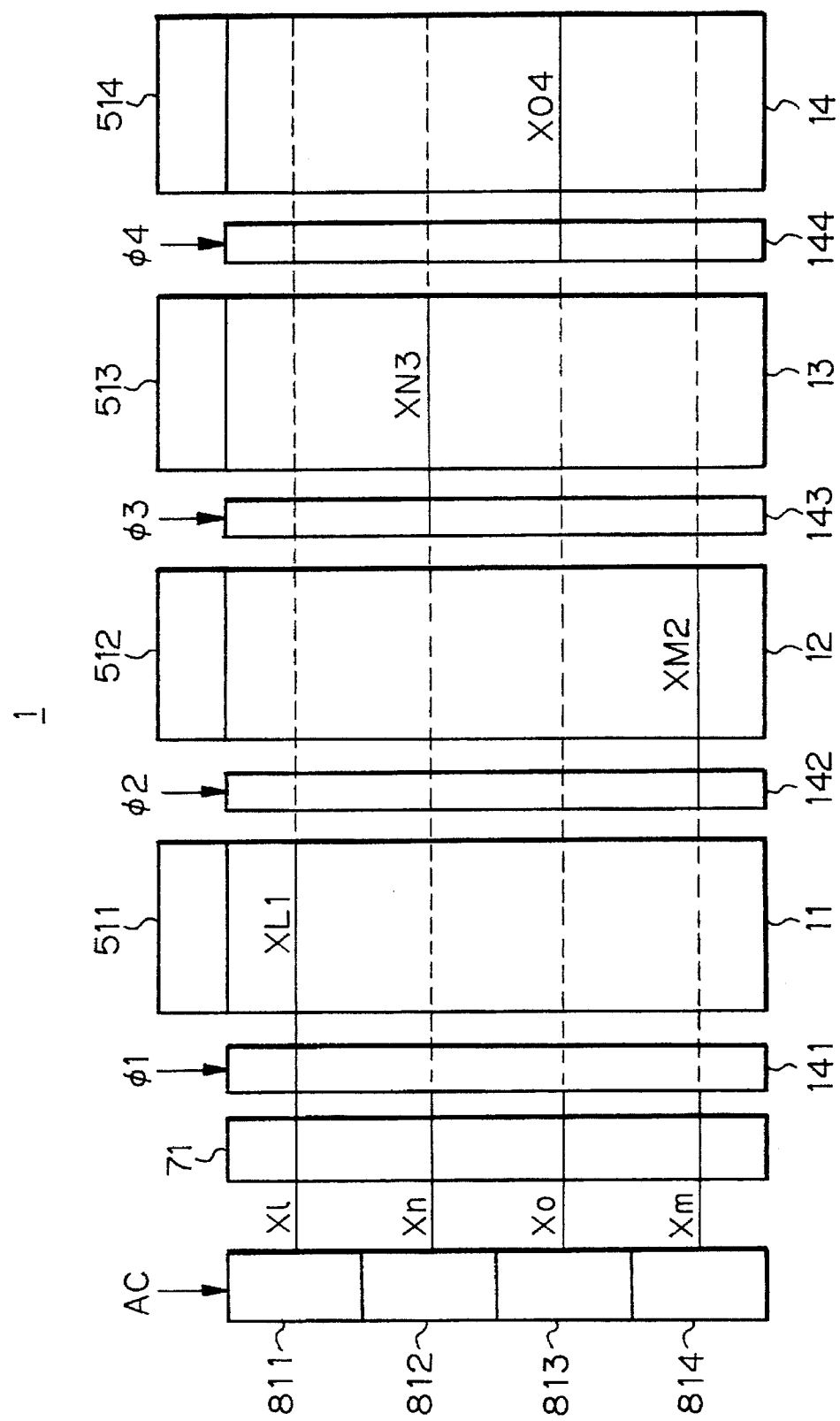
FIG. 5 is a block diagram schematically showing a block included in the first embodiment.

The operation of the illustrative embodiment will be described with reference also made to FIG. 5 which shows a relation between a block 1 and sense amplifiers; the block 1 is, of course, a representative. Sub-block select signals φ1-φ4 are respectively applied to selectors 141-144 and controlled such that data XL1, XM2, XN3 and XO4 on the subword lines corresponding to main word lines XL, XM, XN and XO, respectively, are held by sense amplifiers 511, 512, 513 and 514. On the other hand, the registers 811-814 respectively store addresses Xl, Xm, Xn and Xo corresponding to the main word lines XL, XM, XN and XO, respectively.

Figure 6:
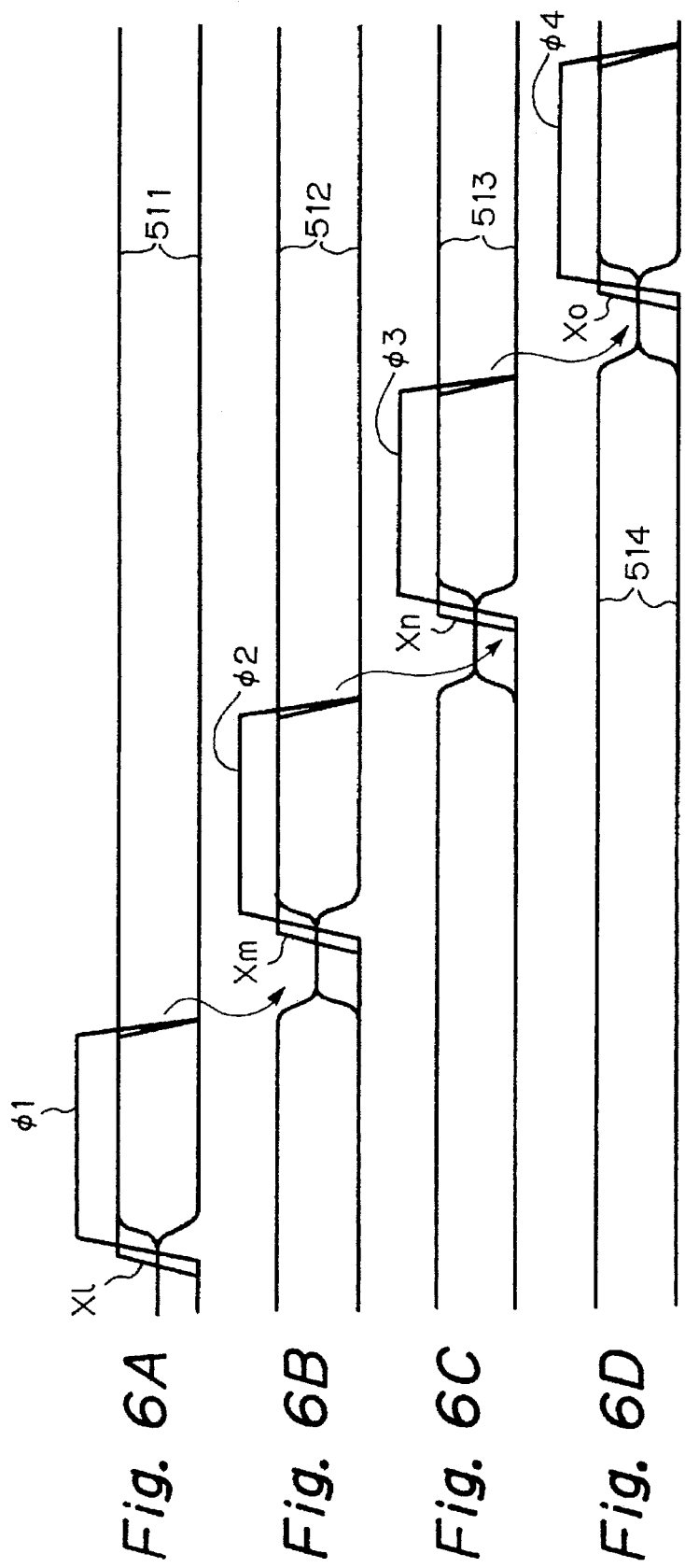
FIGS. 6A, 6B, 6C and 6D are timing charts demonstrating a specific operation of the embodiment.

A reference will also be made to FIGS. 6A-6D for describing the operation more specifically. First, as shown in FIG. 6A, a memory controller 10 precharges the sense amplifier 511 so as to prepare for a new address access. Then, the controller 10 causes the main word signal X1 fed to the main word line WL and the select signal φ1 to go high or active, and then activates the sense amplifier 511 in order to store data therein. Subsequently, the controller 10 causes the signals X1 and φ1 to go low for inactivation. As a result, the data XL1 on the subword line of the sub-block 11 corresponding to the main word line XL is stored in the sense amplifier 511. Thereafter, as shown in FIG. 6B, the controller 10 precharges the sense amplifier 512, stores data therein by activating the main word signal Xm, select signal φ2, and sense amplifier 512, and then inactivates the signals Xm and φ2 so as to store the data in the sense amplifier 512 the data XM2 on the subword line of the subblock 12 corresponding to the main word line XM. As shown in FIG. 6C, the controller stores in the sense amplifier 513 the data XN3 on the subword line of the subblock 13 corresponding to the main word line XN by activating and then inactivating the main word signal Xn and select signal φ3. Finally, as shown in FIG. 6D, the controller 10 stores in the sense amplifier 514 the data XO4 on the subword line of the subblock 14 corresponding to the main word line XO by activating and then inactivating the main word signal Xo and select signal φ4. By the above procedure, the data XL1, XM2, XN3 and XO4 respectively corresponding to the four independent row addresses Xl, Xm, Xn and Xo are respectively held in the sense amplifiers 511-514.

Figure 7:
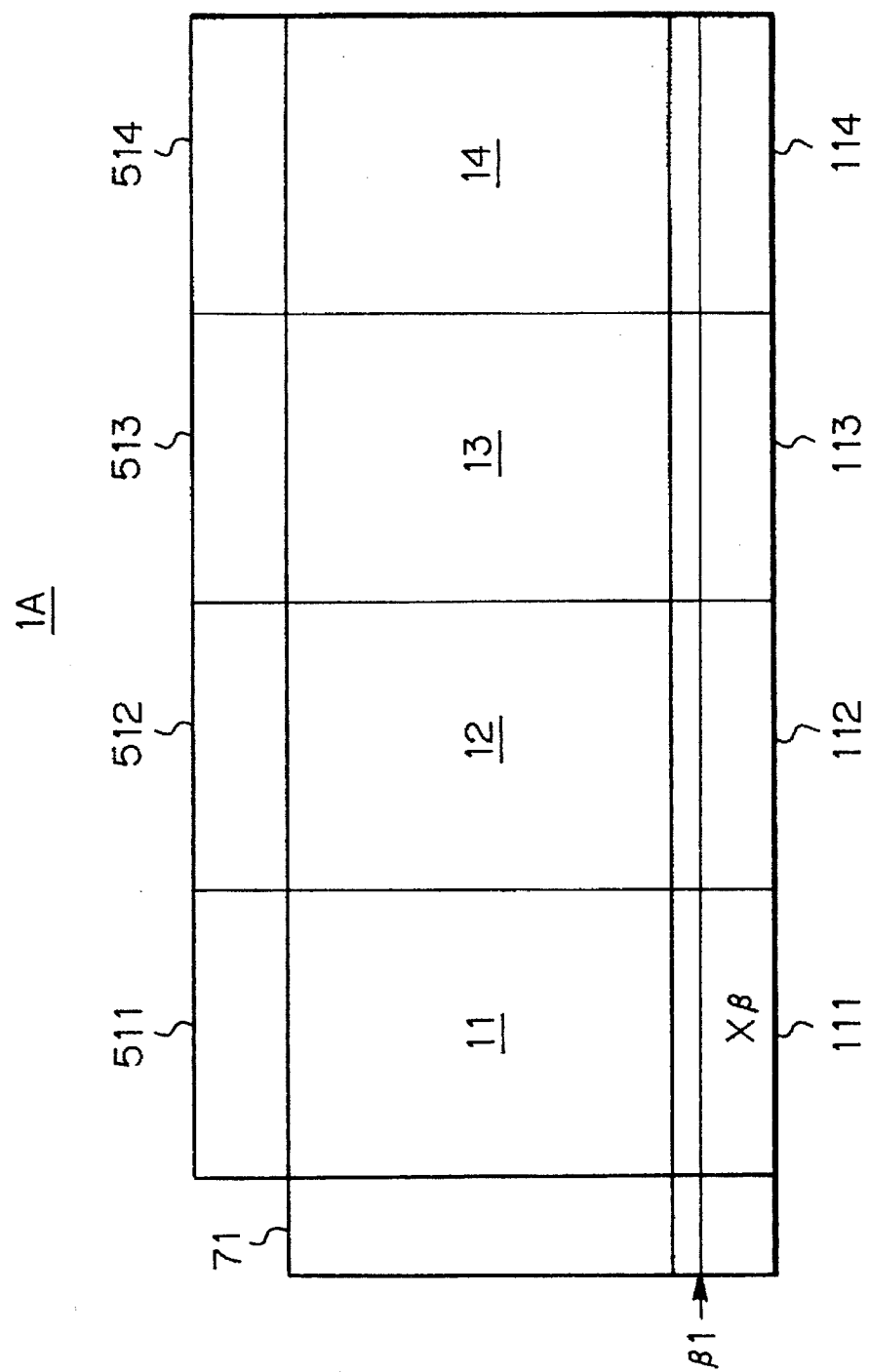
FIG. 7 is a block diagram schematically showing a second embodiment of the present invention.
Figure 8:
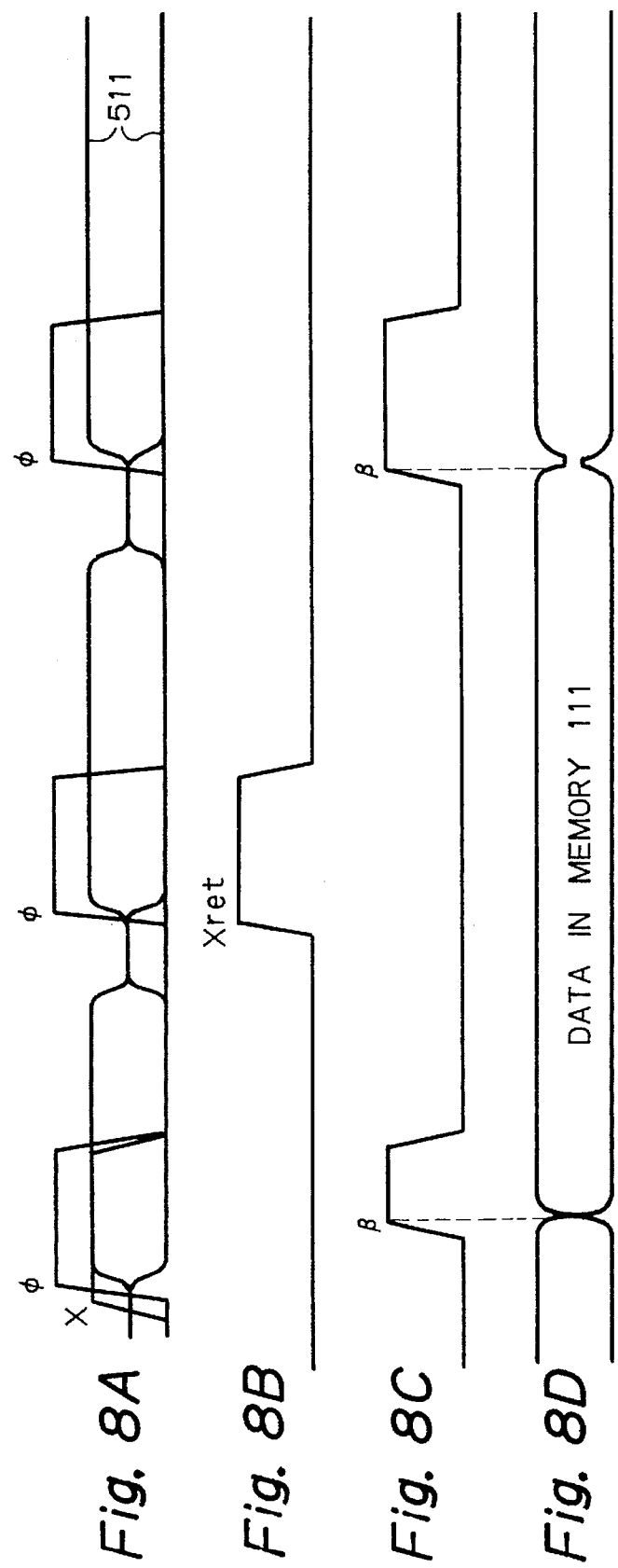
FIGS. 8A, 8B, 8C and 8D are timing charts representative of a specific operation of the second embodiment.

A second embodiment of the present invention will be described with reference to FIGS. 7, 8A and 8B. FIG. 7 shows a block 1A corresponding to the block 1 of FIG. 5. In FIG. 7, the same constituents as the constituents shown in FIG. 5 are designated by the same reference numerals. This embodiment is essentially similar to the first embodiment except for the following. Cache memories 111-114 are respectively associated with the sub-blocks 11-14 which respectively correspond to the sense amplifiers 511-514 sharing the row decoder 71. The cache memories 111-114 respectively hold the data of the sense amplifiers 511-514 for a moment. A main word line XB is driven by a signal β1, which will be described, assigned to the cache memories 111-114. Each of the blocks 11-14 has a single subword line associated with the main word line XB. In this embodiment, blocks 2A-4A are substituted for the blocks 2-4, respectively.

The basic operation of the embodiment will be described with reference to FIGS. 8A-8D. First, as shown in FIG. 8A, the sense amplifier 511 is precharged to access a row address X. At this instant, assume that arbitrary data is stored in the subblock 11A. Subsequently, the main word line X and select signal φ are activated in order to activate the sense amplifier 511. As a result, data corresponding to the subword line is stored in the sense amplifier 511, as in the first embodiment. Then, the signal φ and main word line X are inactivated. Thereafter, the signal β is activated to hold the data of the sense amplifier 511 in the cache memory 111, and then the signal β is inactivated.

Memory cells must be refreshed at a predetermined period. For this purpose, in response to a refresh request, the sense amplifier 511 is precharged, and then a refresh main word line Xref, FIG. 8B, and select signal φ are activated. Subsequently, the sense amplifier 511 is activated so as to refresh the memory cells. As a result, the data held in the sense amplifier 511 turns out data of a refresh address that is different from the main word line X address and, therefore, insignificant. However, the cache memory 111 continuously holds the data of the main word line X address.

After the refreshment operation, the sense amplifier 511 is again precharged. Then, as shown in FIGS. 8C and 8D, the signals β and φ are activated, and then the sense amplifier 511 is activated. As a result, the data of the cache memory 111 is again written to the sense amplifier 511 and can be used, as needed. At the same time, the cell data are again read out and refreshed. Thereafter, the signal β is inactivated, and the cache memory 111 continuously holds the data of the main word line.

Even when the cache memory 111 is implemented by dynamic cells, performance, including a data hold time, comparable with the performance of static cells is achievable if the above re-reading and fresh operation are executed in association with the refresh operation of the sense amplifier.

As stated above, the embodiment allows sense amplifier data to be read out by a refresh operation without regard to the access address of the row decoder. Hence, even when a plurality of sub-blocks respectively associated with sense amplifiers sharing a single row decoder are refreshed at the same time, it is not necessary to recover the cleared data of the sense amplifiers by repeating the reading operation which uses the access address of the row decoder. That is, data corresponding to the different row addresses of the sub-blocks can be recovered by a single cycle by being rewritten to the sense amplifiers.

Figure 9:
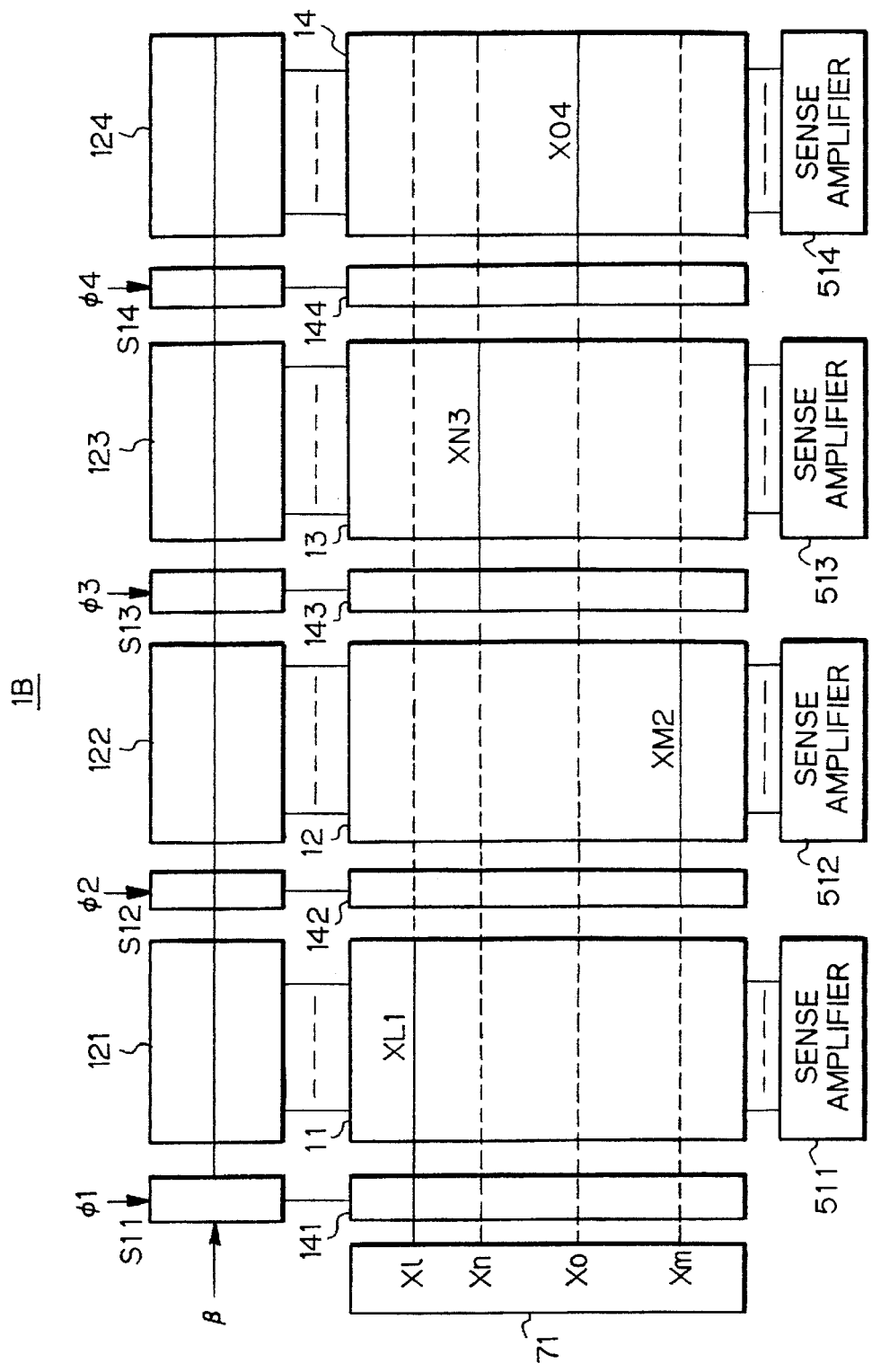
FIG. 9 is a block diagram schematically showing a third embodiment of the present invention.

FIGS. 9 and 10A–10F show a third embodiment of the present invention. FIG. 9 shows a block 1B corresponding to the block 1A shown in FIG. 7. In FIG. 9, the same constituents as the constituents shown in FIG. 7 are designated by the same reference numerals. As shown, this embodiment differs from the second embodiment in that the cache memories 111–114 are respectively replaced with cache memories 121–124 for temporarily saving the data stored in the sense amplifiers 511–514. The cache memories 121–124 are respectively assigned to the subword lines of the sub-blocks 11–14.

The operation of the embodiment will be described with reference also made to FIGS. 10A–10F. The sub-blocks 11–14 are respectively selected by the sub-block select signals φ1–φ4 respectively corresponding to the row addresses Xl, Xm, Xn and Xo, as in the first embodiment. As shown in FIGS. 10A–10D, the sense amplifiers 511–514 are sequentially precharged, the main word lines XL–XO and associated signals φ1–φ4 are activated, and the signal β is activated. Consequently, data are written to the cache memories 121–124 corresponding to the sub-blocks 11–14, respectively. The select signals φ1–φ4 assigned to the selectors 141–144, respectively, are controlled such that the data XL1, XM2, XN3 and XO4 on the subword lines corresponding to the main word lines XL, XM, XN and XO, respectively, are held by the sense amplifiers 511–514.

As shown in FIG. 10E, in the event of a refresh operation, the row decoder drives the main word lines XL–XO as refresh addresses. The subword lines corresponding to the main word lines XL–XO are activated by the signals φ1–φ4, thereby refreshing the sub-blocks 11A–11D. After the refresh operation, the sense amplifiers 511–514 are precharged, as in the first and second embodiments. Subsequently, the signal β is activated, as shown in FIG. 10B, and the signals φ1–φ4 are also activated. As a result, the data of the row addresses corresponding to the cache memories 121–124 are respectively written to the sense amplifiers 511–514 by a single cycle.

As stated above, the third embodiment has cache memories respectively assigned to the sub-blocks on a subword line basis and temporarily saving data stored in the sense amplifiers in the event of a refresh operation. Hence, the sub-blocks whose sense amplifiers store the access data of different row addresses are refreshed at the same time by the selection of the main word lines, and the data of the corresponding sense amplifiers are cleared, the data of the sense amplifiers of the sub-blocks sharing a single row decoder can be recovered if the signals β and φ are activated only once.

A reference will be made to FIG. 11 for describing a fourth embodiment of the present invention. In FIG. 11, the same constituents as the constituents shown in FIG. 5 are designated by the same reference numerals. As shown, this embodiment differs from the first embodiment in that the registers 811–814 are replaced with registers 811A–814A respectively selected by the select signals φ1–φ4, that a register address decoder 15 is provided for decoding register addresses fed form the registers 811A–814A, and that a selector 16 is provided for selecting either the row decoder 71 or the register address decoder 15 as instructed by a select signal SEL.

In operation, the main word signal X is output from the selector 16. In response to the select signal SEL, the selector 16 selects the row decoder in the event of an external access and operates in the same manner as in the first embodiment. In the event re-reading based on the addresses of the registers 811A–814A, the register address decoder 15 decodes the output address of the register corresponding to the sub-block to be re-read and selected by the select signals φ1–φ4. The decoded address is fed to the sub-blocks 11–14 over the main word line X as a main word signal X. As a result, only one of the sub-block sense amplifier groups of each block corresponding to the subword lines can be read by the register address. In this manner, among the plurality of blocks each having the respective row decoder, one block can have the data of its sub-blocks re-read by a single re-reading operation.

In the illustrative embodiment, each block is provided with the respective means for designating a register address. This makes it possible to give a particular register address to each sub-block and, therefore, to reread data out of a plurality of sub-blocks by a single cycle. Further, by feeding a refresh address to a plurality of sub-blocks via the associated row decoder for a refresh operation and effecting the above re-reading, it is possible to recover the data by a single cycle.

Generally, cache holding means for enhancing the performance of a memory should preferably hold data around the latest accessed data. However, in a DRAM or similar memory needing periodic refresh operations, the refresh operation clears data held in sense amplifiers. Further, the cache holding means should preferably hold data in a unit size having the greatest possible freedom.

The present invention enhances the freedom of the cache holding means by using the main word line and subword line structure particular to a DRAM, implements the rapid recovery of data when data stored in sense amplifiers are cleared by a refresh operation and in addition causes a minimum of increase in chip size and, therefore, in cost. The cache holding means of the invention can hold data in a unit size corresponding to a sub-block associated with each subword line. Hence, for data sized smaller than a single word corresponding to a main word line and capable of being held in a distributed manner, the number of entries and, therefore, the cache hit ratio can be remarkably improved. This realizes an access speed high enough to enhance the performance of a computer system.

Various modifications will become possible for those skilled in the art after receiving the teachings of the present disclosure without departing from the scope thereof.

What is claimed is:

1. A semiconductor memory comprising:
   a plurality of memory cell blocks constituted by dividing, on the basis of a first predetermined number of rows, memory cell arrays each having memory cells arranged in rows and columns and allowing data to be selectively input or output when a row address and a column address are designated;

said plurality of memory cell blocks each comprising:

sub-blocks subdivided by a second predetermined number in a column direction, each of said sub-blocks holding data corresponding to a particular row address and being individually addressable;

main word lines provided in said first predetermined number, each of said main word lines corresponding to a row address assigned to each of said first predetermined number of rows;

subword lines provided in said second predetermined number and constituted by dividing said main word lines in correspondence with said second predetermined number of sub-blocks;

sub-word line selecting means for selecting any one of said sub-word lines in response to a sub-block select signal; and cache holding means for holding cache data stored in one row of memory cells of the main word line corresponding to a selection row address designated beforehand;

data being selectively written to or read out of said cache holding means when an external row address designated from the outside and the selection row address are coincident;

said semiconductor memory further comprising row address holding means provided in said first predetermined number, and for holding said first predetermined number of row addresses and selectively outputting contents thereof in response to said sub-block select signal;

said cache holding means holding said second predetermined number of subrow data which are one row of data of said sub-blocks respectively corresponding to said subword lines respectively corresponding to said first predetermined number of row addresses.

2. A memory as claimed in claim 1, wherein said cache holding means comprises, for each of said plurality of memory cell blocks, sense amplifiers provided in said second predetermined number and for sensing and holding the subrow data.

3. A memory as claimed in claim 2, wherein said cache holding means further comprises:

subcache memories provided in said second predetermined number, and for respectively storing data stored in said sense amplifiers; and subcache transferring means for transferring the data from said second predetermined number of sense amplifiers to said subcache memories.

4. A memory as claimed in claim 1, wherein said first predetermined number of row address holding means comprise registers provided in said first predetermined number and for respectively storing said first predetermined number of row addresses, and wherein said first predetermined number of row address selecting means comprise a selector for selecting any one of said registers in response to a column address corresponding to the sub-block.

5. A memory as claimed in claim 1, wherein said cache holding means comprises:

a cache memory for storing one row of cache data corresponding to the main word line; and cache transferring means for transferring the cache data to said cache memory.

6. A semiconductor memory comprising:

a plurality of memory cell blocks constituted by dividing, on the basis of a first predetermined number of rows, memory cell arrays each having memory cells arranged in rows and columns and allowing data to be selectively input or output when a row address and a column address are designated;

said plurality of memory cell blocks each comprising;

sub-blocks subdivided by a second predetermined number in a column direction, each of said sub-block holding data of a particular row address and being individually addressable;

main word lines provided in said first predetermined number, and each corresponding to a row address assigned to each of said first predetermined number of rows;

subword lines provided in said second predetermined number and constituted by dividing said main word lines in correspondence with said second predetermined number of sub-blocks;

subword line selecting means for selecting any one of said subword lines in response to a sub-block select signal; and cache holding means for holding cache data stored in one row of memory cells of the main word line corresponding to a selection row address designated beforehand;

data being selectively written to or read out of said cache holding means when an external row address designated from the outside and the selection row address are coincident;

said semiconductor memory further comprising:

subrow address holding means provided in said second predetermined number, and for respectively holding sub-row addresses provided in said second predetermined number;

subrow address selecting means for selecting, in response to said sub-block select signal, one of said second predetermined number of subrow address holding means to thereby generate a first main word select signal;

a row decoder for decoding the external row address to thereby generate a second main word select signal; and main word signal selecting means for selecting either said first main word signal or said second main word signal in response to a control signal;

said cache holding means holding said second predetermined number of subrow data which are one row of data of the sub-blocks respectively corresponding to said subword lines respectively corresponding to said first predetermined number of row addresses.

* * * * *